(12) United States Patent
Hong et al.

(10) Patent No.: US 10,593,241 B2
(45) Date of Patent: Mar. 17, 2020

(54) DATA DRIVER, ORGANIC LIGHT EMITTING DISPLAY DEVICE AND METHOD FOR DRIVING THEREOF

(71) Applicant: LG DISPLAY CO., LTD., Seoul (KR)

(72) Inventors: Moo Kyoung Hong, Paju-si (KR); Kyungsu Lee, Paju-si (KR); Sang Goo Kwon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 240 days.

(21) Appl. No.: 15/680,916

(22) Filed: Aug. 18, 2017

(65) Prior Publication Data

US 2018/0061292 A1 Mar. 1, 2018

(30) Foreign Application Priority Data

Aug. 30, 2016 (KR) .................. 10-2016-0110627

(51) Int. Cl.
| | | |
|---|---|---|
| *G09G 3/00* | (2006.01) | |
| *G09G 3/3233* | (2016.01) | |
| *G01R 31/26* | (2020.01) | |
| *G09G 3/3225* | (2016.01) | |
| *G09G 3/3275* | (2016.01) | |

(52) U.S. Cl.
CPC .......... *G09G 3/006* (2013.01); *G09G 3/3233* (2013.01); *G01R 31/2635* (2013.01); *G09G 3/3225* (2013.01); *G09G 3/3275* (2013.01); *G09G 2300/0842* (2013.01); *G09G 2320/0295* (2013.01); *G09G 2330/12* (2013.01)

(58) Field of Classification Search
CPC .... G09G 3/006; G09G 3/3233; G09G 3/3225; G09G 2300/0842; G09G 2320/0295
USPC ...................................... 324/762.07
See application file for complete search history.

(56) References Cited

U.S. PATENT DOCUMENTS

| | | |
|---|---|---|
| 6,496,168 B1 | 12/2002 | Tomida |
| 2011/0115770 A1 | 5/2011 | Seo et al. |
| 2016/0189625 A1 | 6/2016 | Kim et al. |
| 2017/0032738 A1* | 2/2017 | Lee ............... G09G 3/3233 |

FOREIGN PATENT DOCUMENTS

| | | |
|---|---|---|
| CN | 104658472 A | 5/2015 |
| CN | 104732920 A | 6/2015 |
| CN | 105741761 A | 7/2016 |

* cited by examiner

*Primary Examiner* — Melissa J Koval
*Assistant Examiner* — Courtney G McDonnough
(74) *Attorney, Agent, or Firm* — Seed IP Law Group LLP (57) ABSTRACT

The present disclosure relates to a method for detecting a defect of a sensing transistor disposed in each sub pixel of an organic light emitting display device and extracting a coordinate of a sub pixel in which a defective sensing transistor is disposed. A defect detecting data voltage is applied to a data line after initializing a reference voltage line and a voltage of the reference voltage line is sensed during an interval in which the scan transistor is turned on and the sensing transistor is turned off to determine whether the sensing transistor is defective.

18 Claims, 8 Drawing Sheets

DATA DRIVER, ORGANIC LIGHT EMITTING DISPLAY DEVICE AND METHOD FOR DRIVING THEREOF

CROSS-REFERENCE TO RELATED APPLICATIONS

This application claims priority from Korean Patent Application No. 10-2016-0110627, filed on Aug. 30, 2016, which is hereby incorporated by reference in its entirety for all purposes as if fully set forth herein.

BACKGROUND OF THE DISCLOSURE

Technical Field

The present example embodiments relate to an organic light emitting display device, a driving method of an organic light emitting display device, and a data driver included in an organic light emitting display device.

Description of the Related Art

An organic light emitting display device which is getting the spotlight as a display device in recent years uses a self-emitting organic light emitting diode (OLED). Therefore, the organic light emitting display device has a high response speed and is advantageous in terms of a contrast ratio, emission efficiency, brightness, and a viewing angle.

Such an organic light emitting display device displays an image by disposing organic light emitting diodes (OLED) and sub pixels including driving transistors driving the OLEDs in a matrix and controlling a brightness of a sub pixel selected by a scan signal according to a gray scale of data.

Each sub pixel includes a scan transistor which operates by a scan signal and controls a data voltage applied to a driving transistor, a capacitor which maintains a data voltage applied to the driving transistor for one frame, and a sensing transistor which is connected to a reference voltage line in addition to an organic light emitting diode OLED and the driving transistor.

In such a circuit element disposed in the sub pixel, a defect may be generated due to a foreign substance and the sub pixel in which a defective circuit element is included may be represented as a bright spot or a dark spot.

Therefore, it is required to detect a defect of a circuit element disposed in each sub pixel. However, it is difficult to precisely detect a coordinate of a sub pixel in which a defective circuit element is disposed or precisely determine a defective circuit element among circuit elements disposed in the sub pixel.

Specifically, it is desired to detect a defect of a circuit element which is generated after shipment of the organic light emitting display device and provide information on the circuit element detected as a defective circuit element and a coordinate of the sub pixel in which the circuit element is disposed.

BRIEF SUMMARY DISCLOSURE

An aspect of the present disclosure is to provide an organic light emitting display device which detects a defect of a sensing transistor connected to a reference voltage line among circuit elements disposed in the sub pixel and a driving method thereof.

Another aspect of the present disclosure is to provide an organic light emitting display device which precisely extracts a coordinate of the sub pixel in which a sensing transistor detected to be defective is disposed and a driving method thereof.

Another aspect of the present disclosure is to provide an organic light emitting display device which detects a defect of a sensing transistor which is generated after shipment of the organic light emitting display device and provides information on the defective sensing transistor and a driving method thereof.

According to an aspect of the present example embodiments, there is provided an organic light emitting display device, including: an organic light emitting diode, and a sub pixel in which a driving transistor which drives the organic light emitting diode, a scan transistor electrically connected between a first node and a data line, and a sensing transistor electrically connected between a second node of the driving transistor and the reference voltage line are disposed.

The organic light emitting display device further includes a sensing unit which senses a voltage of the reference voltage line during an interval in which a defect detecting data voltage is applied to the data line, the scan transistor is an on state, and the sensing transistor is an off state.

A reference voltage control switch may be connected to the reference voltage line and the reference voltage control switch may be turned on before the sensing unit senses the voltage of the reference voltage line to initialize the reference voltage line and then turned off.

Further, a sampling switch may be connected to the reference voltage line and when the defect detecting data voltage is applied to the data line in an off state of the sensing transistor and a predetermined time elapses after the scan transistor is at an on state, the sensing unit may turn on the sampling switch to sense the voltage of the reference voltage line.

The organic light emitting display device may further include a defect detecting unit and the defect detecting unit may compare the voltage sensed by the sensing unit and the predetermined voltage and determine whether the sensing transistor is defective according to a comparison result.

The organic light emitting display device may further include a memory which stores a coordinate of a sub pixel in which a defective sensing transistor is disposed and when the sensing transistor is determined to be defective, the defect detecting unit may compare a coordinate of a sub pixel in which a sensing transistor determined to be defective is disposed and a coordinate stored in the memory and update the coordinate stored in the memory.

According to another aspect of the present example embodiments, there is provided a driving method of an organic light emitting display device, including: turning on a reference voltage control switch connected to a reference voltage line to initialize the reference voltage line, turning off a sensing transistor connected to the reference voltage line, applying a defect detecting data voltage to a data line and turning on a scan transistor, sensing the voltage of the reference voltage line when the scan transistor is turned on and a predetermined time elapses, determining that the sensing transistor is defective when the sensed voltage is higher than a predetermined voltage, and storing a coordinate of a sub pixel in which the sensing transistor is disposed, in a memory, when it is determined that the sensing transistor is defective.

According to still another aspect of the present example embodiments, there is provided a data driver including: a sensing unit which senses a voltage of the reference voltage line during an interval when a defect detecting data voltage is applied to the data line, the scan transistor connected between a first node of the driving transistor and the data line is at an on state, and senses a voltage of the reference voltage line during an interval in which a sensing transistor connected between the second node of the driving transistor and the reference voltage line is at an off state, a defect detecting unit which compares the voltage sensed by the sensing unit and a predetermined voltage and determines whether the sensing transistor is defective based on a comparison result, and a memory which stores a coordinate of a pixel in which the sensing transistor detected to be defective by the defect detecting unit is disposed.

According to the present example embodiments, during an interval in which a scan transistor is turned on and a sensing transistor is turned off, a defect detecting data voltage is applied to a data line and a voltage of the reference voltage line is sensed, thereby detecting a defect of the sensing transistor.

According to the present example embodiments, a defective sensing transistor is determined through a logic which detects a defect of the sensing transistor so that a coordinate of the sub pixel in which the defective sensing transistor is disposed is precisely detected and the defect generated after shipment is also detected.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Hereinafter, some embodiments of the present disclosure will be described in detail with reference to the accompanying drawings. When reference numerals refer to components of each drawing, although the same components are illustrated in different drawings, the same components are referred to by the same reference numerals as possible. Further, if it is considered that description of related known configuration or function may cloud the gist of the present disclosure, the description thereof will be omitted.

Further, in describing components of the present disclosure, terminologies such as first, second, A, B, (a), (b), and the like may be used. The terminologies are used to distinguish one component from another component. However, a nature, an order, a sequence, or the number of components is not limited by the terminologies. If it is described that a component is "connected," "coupled" or "accessed" to another component, it is understood that the component is directly connected or accessed to the other component but a component may be interposed between the components or the components may be "connected," "coupled" or "accessed" through another component.

Figure 1:
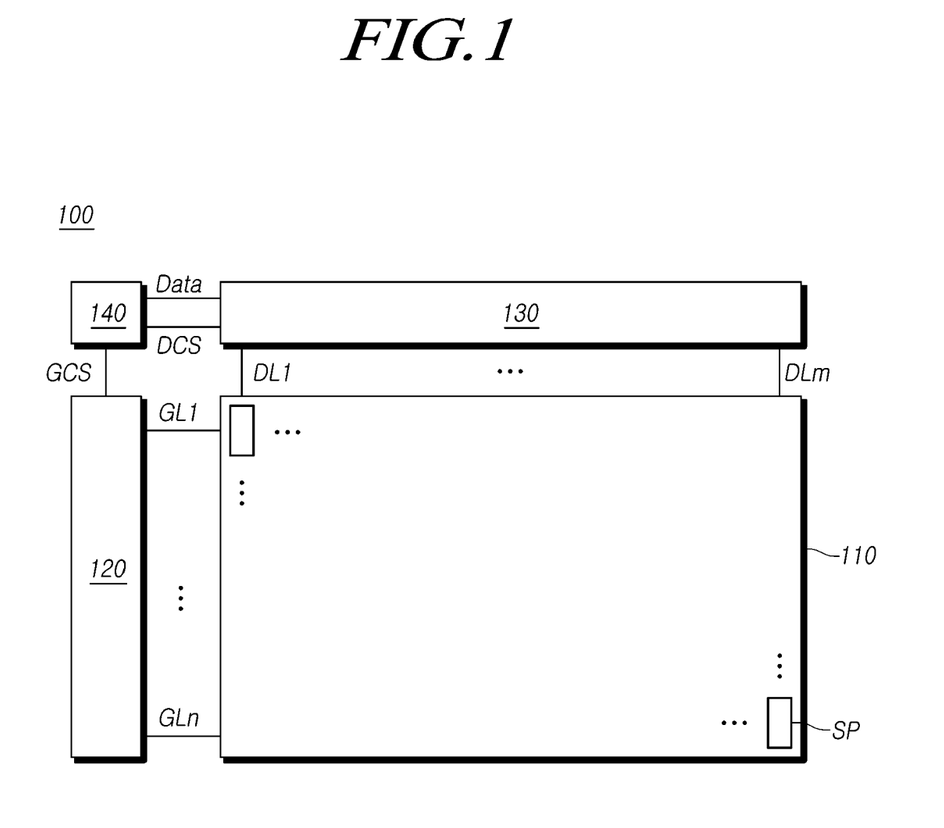
FIG. 1 is a view illustrating a schematic configuration of an organic light emitting display device according to the present example embodiments.

FIG. 1 illustrates a schematic configuration of an organic light emitting display device 100 according to the present example embodiments.

Referring to FIG. 1, the organic light emitting display device 100 according to the present example embodiments includes an organic light emitting display panel 110 in which a plurality of gate lines GL, a plurality of data lines DL, and a plurality of sub pixels SP are disposed, a gate driver 120 which drives the plurality of gate lines GL, a data driver 130 which drives the plurality of data lines DL, and a controller 140 which controls the gate driver 120 and the data driver 130.

The gate driver 120 sequentially supplies scan signals to the plurality of gate lines GL to sequentially drive the plurality of gate lines GL.

The gate driver 120 sequentially drives the plurality of gate lines GL by sequentially supplying ON voltage or OFF voltage scan signals to the plurality of gate lines GL according to the control of the controller 140.

According to a driving method, the gate driver 120 may be located only at one side of the organic light emitting display panel 110 or located at both sides thereof.

Further, the gate driver 120 may include one or more gate driver integrated circuits.

Each of the gate driver integrated circuits may be connected to a bonding pad of the organic light emitting display panel 110 by a tape automated bonding (TAB) process or a chip on glass (COG) process or implemented as a gate in panel (GIP) type to be directly disposed in the organic light emitting display panel 110.

Further, each of the gate driver integrated circuits may be integrated to be disposed in the organic light emitting display panel 110 or implemented through a chip on film (COF) process to be mounted on a film connected to the organic light emitting display panel 110.

The data driver 130 drives the plurality of data lines DL by supplying a data voltage to the plurality of data lines DL.

When a specific gate line is open, the data driver 130 converts image data received from the controller 140 into an analog data voltage to supply the converted analog data voltage to the plurality of data lines DL, thereby driving the plurality of data lines DL.

The data driver 130 includes at least one source driver integrated circuit to drive the plurality of data lines DL.

Each of the source driver integrated circuits may be connected to the bonding pad of the organic light emitting display panel 110 by a tape automated bonding (TAB) process or a chip on glass (COG) process. Each of the gate driver integrated circuits may also be directly disposed in the organic light emitting display panel 110, or may be integrated to be disposed in the organic light emitting display panel 110.

Further, each of the source driver integrated circuits may be implemented by a chip on film (COF) process. In this case, one end of each of the source driver integrated circuits is bonded to at least one source printed circuit board and the other end is bonded to the organic light emitting display panel 110.

The controller 140 supplies various control signals to the gate driver 120 and the data driver 130 to control the gate driver 120 and the data driver 130.

The controller 140 starts scanning according to a timing implemented in each frame, converts input image data input from the outside to be suitable for a data signal form used by the data driver 130 to output the converted image data. The controller 140 controls data driving at a proper time corresponding to the scanning.

The controller 140 receives various timing signals including a vertical synchronization signal Vsync, a horizontal synchronization signal Hsync, an input data enable (DE) signal, and a clock signal CLK together with the input image data, from the outside (for example, a host system).

The controller 140 converts the input image data input from the outside to be suitable for a data signal form used in the data driver 130 to output the converted image data. In addition, in order to control the data driver 130 and the gate driver 120, the controller 140 receives the timing signal such as the vertical synchronization signal Vsync, the horizontal synchronization signal Hsync, the input data enable signal DE, and the clock signal CLK to generate various control signals, thereby outputting the control signals to the gate driver 120 and the data driver 130.

For example, in order to control the gate driver 120, the controller 140 outputs various gate control signals GCS including a gate start pulse GSP, a gate shift clock GSC, and a gate output enable signal GOE.

Here, the gate start pulse GSP controls an operation start timing of one or more gate driver integrated circuits included in the gate driver 120. The gate shift clock GSC is a clock signal which is commonly input to one or more gate driver integrated circuits and controls a shift timing of the scan signal (gate pulse). The gate output enable signal GOE designates timing information of one or more gate driver integrated circuits.

Further, in order to control the data driver 130, the controller 140 outputs various data control signals DCS including a source start pulse SSP, a source sampling clock SSC, and a source output enable signal SOE.

Here, the source start pulse SSP controls a data sampling start timing of one or more source driver integrated circuits included in the data driver 130. The source sampling clock SSC is a clock signal which controls a sampling timing of data in each of the source driver integrated circuits. The source output enable signal SOE controls an output timing of the data driver 130.

The controller 140 may be disposed in a control printed circuit board which is connected to a source printed circuit board to which the source driver integrated circuit is bonded, through a connecting medium such as a flexible flat cable FFC or a flexible printed circuit FPC.

In such a control printed circuit board, a power controller (not illustrated) which supplies various voltages or currents to the organic light emitting display panel 110, the gate driver 120, and the data driver 130 or controls the various voltages or currents to be supplied may be further disposed. Such a power controller is also referred to as a power management IC.

In the organic light emitting display device 100, each sub pixel disposed in the organic light emitting display panel 110 may include circuit elements such as an organic light emitting diode OLED, two or more transistors, and at least one capacitor.

The type and the number of circuit elements included in each sub pixel may be diversely determined in accordance with a providing function and a design method.

Figure 2:
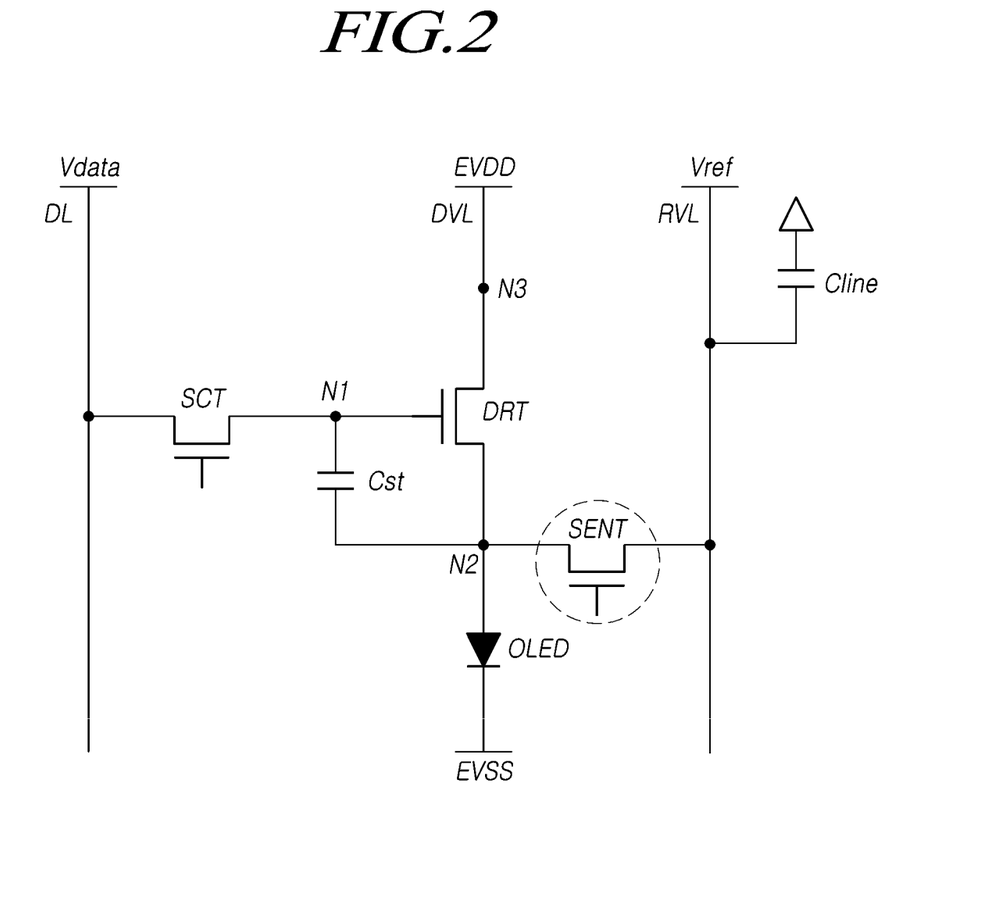
FIG. 2 is a view illustrating an example of a pixel structure disposed in an organic light emitting display device according to the present example embodiments.

FIG. 2 illustrates an example of a sub pixel structure disposed in an organic light emitting display panel 110 according to the present example embodiments.

Referring to FIG. 2, each sub pixel includes an organic light emitting diode OLED and a driving transistor DRT which drives the organic light emitting diode OLED.

Further, each sub pixel may include a storage capacitor Cst electrically connected between a first node N1 and a second node N2 of the driving transistor DRT, a scan transistor SCT which is controlled by the scan signal and electrically connected between the first node N1 of the driving transistor DRT and a corresponding data line DL, and a sensing transistor SENT electrically connected between the second node N2 of the driving transistor DRT and a reference voltage line RVT.

The organic light emitting diode OLED is formed by a first electrode (for example, an anode electrode or a cathode electrode), an organic layer, and a second electrode (for example, a cathode electrode or an anode electrode).

For example, the second node N2 of the driving transistor DRT is connected to the first electrode of the organic light emitting diode OLED and a base voltage EVSS may be applied to the second electrode of the organic light emitting diode OLED.

The driving transistor DRT supplies a driving current to the organic light emitting diode OLED to drive the organic light emitting diode OLED. The driving transistor has a first node N1 corresponding to a gate node, a second node N2 corresponding to a source node or a drain node, and a third node N3 corresponding to a drain node or a source node.

The scan transistor SCT transmits a data voltage to the first node N1 of the driving transistor DRT and is electrically connected between the first node N1 of the driving transistor DRT and the data line DL. The scan transistor SCT is turned on by a scan signal which is applied to the gate node to transmit the data voltage to the first node N1 of the driving transistor DRT.

The storage capacitor Cst is electrically connected between the first node N1 and the second node N2 of the driving transistor DRT to maintain a predetermined voltage for one frame.

The sensing transistor SENT is electrically connected between the second node N2 of the driving transistor DRT and the reference voltage line RVL and is controlled by the scan signal which is applied to the gate node.

The sensing transistor SENT is turned on to apply a reference voltage Vref supplied through the reference voltage line RVL to the second node N2 of the driving transistor DRT.

Further, the sensing transistor SENT may be used to sense degradation of the circuit element such as an organic light emitting diode OLED or a driving transistor DRT included in the sub pixel.

For example, the sensing transistor SENT is turned off for a period of time by a control signal, then the sensing transistor SENT may be turned on after floating a voltage of the second node N2 to sense the voltage of the second node N2 through the reference voltage line RVL and measure a degradation level of the circuit element.

Therefore, it is very important that the sensing transistor SENT normally operates to supply a reference voltage Vref to the second node N2 or sense a voltage of the second node N2. However, there is a problem in that when a defect occurs in the sensing transistor SENT due to a foreign substance, it is difficult to detect the defect.

The present example embodiments provide a method for detecting a defect of the sensing transistor SENT in the above-described structure of the sub pixel and a method for precisely detecting a coordinate of the sub pixel in which a defective sensing transistor SENT is disposed.

Figure 3:
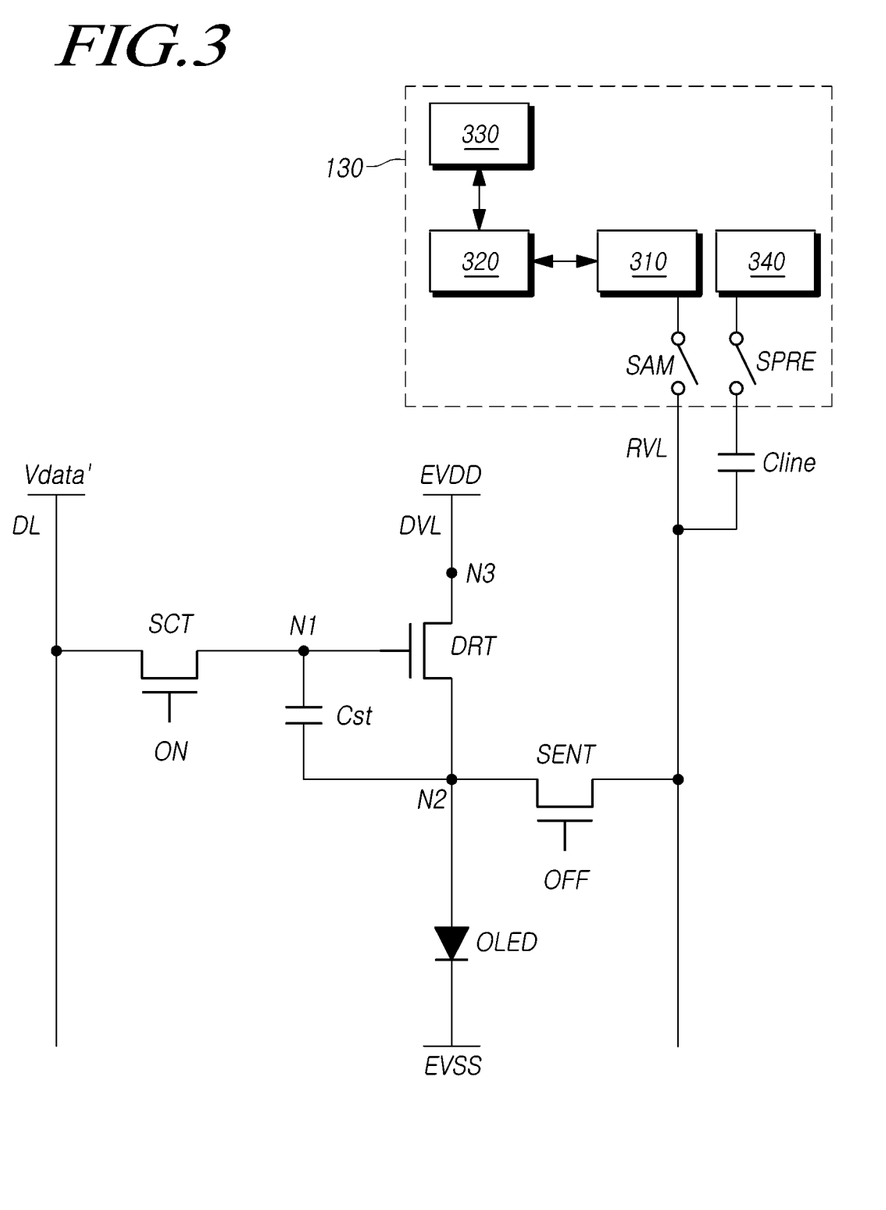
FIG. 3 is a view illustrating a configuration of detecting a defect of a sensing transistor in an organic light emitting display device according to the example embodiments.

FIG. 3 illustrates a configuration of detecting a defect of a sensing transistor SENT disposed in a sub pixel in the organic light emitting display device 100 according to the present example embodiments.

Referring to FIG. 3, in order to detect whether the sensing transistor SENT disposed in each sub pixel is defective, the organic light emitting display device 100 according to the present example embodiments applies a defect detecting data voltage Vdata' to the data line DL and controls a scan transistor SCT to be turned on, and senses a voltage of a reference voltage line RVL after controlling the sensing transistor SENT to be turned off.

In this case, the driving voltage EVDD which is applied to the driving voltage line DVL may be applied as a driving voltage EVDD for driving a sub pixel and a base voltage EVSS may be applied to the second electrode of the organic light emitting diode OLED.

An interval in which the defect of the sensing transistor SENT is detected is temporally separated from an interval for display driving of the organic light emitting display device 100. For example, the defect detecting may be performed before starting the display driving or after completing the display driving. Further, in some cases, during the display driving interval, whether the sensing transistor SENT is defective may be sensed in a blank period between frames.

In order to sense whether the sensing transistor SENT is defective, a driving voltage EVDD and a base voltage EVSS are applied in a state in which the sensing transistor SENT is off.

Further, a defect detecting data voltage Vdata' is applied to a sub pixel which detects the defect of the sensing transistor SENT through the data line DL and the scan transistor SCT is controlled to be turned on to apply a voltage to the gate of the driving transistor DRT.

Therefore, in a state in which a voltage is applied to the second node and the sensing transistor SENT is turned off, a voltage of the reference voltage line RVL is sensed, so that it is possible to determine whether the sensing transistor SENT is defective.

Specifically, the organic light emitting display device 100 according to the present example embodiments may include within the data driver 130, a sensing unit 310, a defect detecting unit 320, and a memory 330 to detect the defect of the sensing transistor SENT. Further, the organic light emitting display device 100 according to the present example embodiments may include a reference voltage control unit 340 which controls a voltage applied to the reference voltage line RVL.

The reference voltage control unit 340 is connected to a reference voltage control switch SPRE which is connected to the reference voltage line RVL. The reference voltage control unit 340 controls an operation of the reference voltage control switch SPRE.

The reference voltage control unit 340 turns on the reference voltage control switch SPRE, before the sensing unit 310 senses a voltage of the reference voltage line RVL to detect the defect of the sensing transistor SENT, to initialize the reference voltage line RVL.

When the reference voltage line RVL is initialized by the reference voltage control unit 340, a driving voltage EVDD is applied to the driving voltage line DVL, a base voltage EVSS is applied to the second electrode of the organic light emitting diode OLED, and a defect detecting data voltage Vdata' is applied to the data line DL.

In an example, simultaneously, the scan transistor SCT is turned on and the sensing transistor SENT is turned off by a scan signal.

In one embodiment, a scan signal for the scan transistor SCT and a control signal for the sensing transistor SENT may be generated from a same scan signal, with one being the inversion of the other.

In another embodiment, different signals are used to control the on/off turning of the scan transistor SCT and the sensing transistor SENT, and the scan transistor SCT and the sensing transistor SENT may each be turned on/off concurrently with one another or may be turned on/off with different timing from one another. Namely, for example, the scan transistor SCT may be turned on after the sensing transistor SENT is turned off.

When a predetermined time elapses after the scan transistor SCT is turned on and the sensing transistor SENT is turned off, the sensing unit 310 turns on a sampling switch SAM connected to the reference voltage line RVL to sense the voltage of the reference voltage line RVL.

Since the voltage is applied to the second node N2 by controlling the voltage line and the transistor which are disposed on the sub pixel and the sensing transistor SENT is turned off, when the sensing transistor SENT is normal, an initialized voltage of the reference voltage line RVL is sensed.

In contrast, when the sensing transistor SENT is defective due to a foreign substance, the voltage of the reference voltage line RVL sensed by the sensing unit 310 will be the voltage of the second node N2, so that it is possible to determine whether the sensing transistor SENT is defective based on the voltage value sensed by the sensing unit 310.

When the sensing unit 310 senses the voltage of the reference voltage line RVL, the sensed voltage is transmitted to the defect detecting unit 320.

The defect detecting unit 320 compares a voltage sensed by the sensing unit 310 with a predetermined voltage, i.e., a threshold voltage, and determines whether the sensing transistor SENT is defective according to a comparison result.

For example, the predetermined voltage (i.e., the threshold voltage) may be associated with the initialized voltage of the reference voltage line RVL. When the sensed voltage is equal to the initialized voltage of the reference voltage line RVL, the defect detecting unit 320 determines that the sensing transistor SENT is normal and when the sensed voltage is higher than the initialized voltage, the defect detecting unit 320 determines that the sensing transistor SENT is defective.

Even though the sensing transistor SENT is normal, a little leakage current may be generated. Therefore, only when the sensed voltage is higher than the predetermined voltage, e.g., not slightly higher than the initialized voltage due to the leakage, the defect detecting unit 320 may determine that the sensing transistor SENT is defective.

When it is determined that the sensing transistor SENT is defective, the defect detecting unit 320 checks a coordinate, i.e., location, of a sub pixel in which the defective sensing transistor SENT is disposed.

According to an example embodiment(s), the defect detecting data voltage Vdata' is supplied to each sub pixel, the scan transistor SCT and the sensing transistor SENT disposed in each sub pixel are controlled by a scan signal. Further, as the defect of the sensing transistor SENT is detected, an XY coordinate of the sub pixel in which the defective sensing transistor SENT is disposed may be precisely extracted. It should be appreciated that other approaches are also possible and included in the disclosure. For example, it is possible that only a selected or random portion of sub pixels are checked for defective sensing transistors SENT at a time.

When the defect detecting unit 320 extracts a coordinate of the sub pixel in which the defective sensing transistor SENT is disposed, the defect detecting unit 320 compares the extracted coordinate with a coordinate stored in the memory 330.

When the extracted coordinate does not correspond to a coordinate which is previously stored in the memory 330, the defect detecting unit 320 adds the extracted coordinate to the memory 330 so as to consistently update the coordinate of the sub pixel of the defective sensing transistor SENT stored in the memory.

By doing this, a coordinate of the sub pixel of the defective sensing transistor SENT is precisely extracted and the extracted coordinate is updated so that it is possible to easily repair the sub pixel using coordinate data of the defective sensing transistor SENT stored in the memory 330 thereafter.

Figure 4:
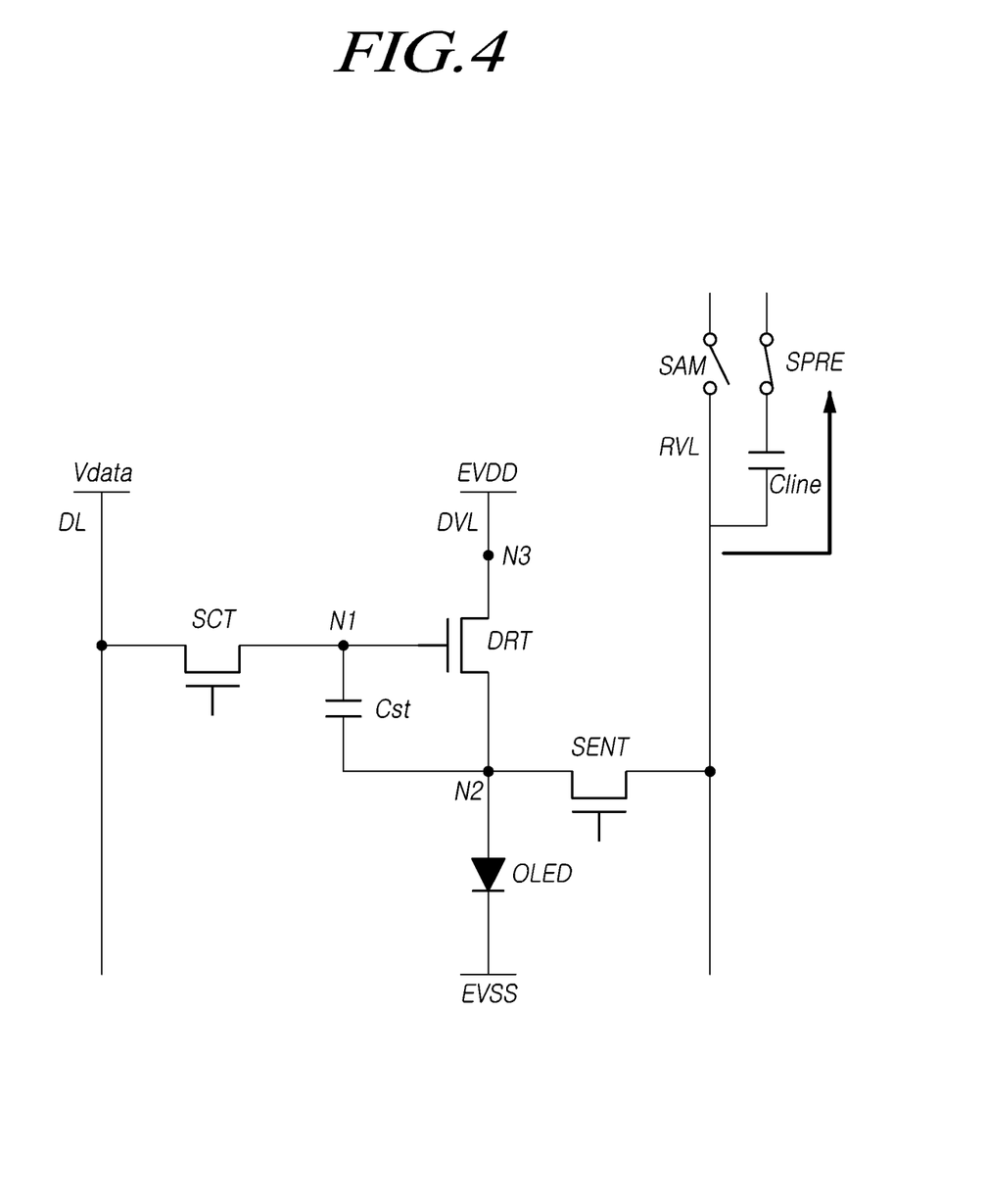
FIGS. 4 to 6 are views for explaining a process of detecting a defect of a sensing transistor in an organic light emitting display device according to the present example embodiments.
Figure 5:
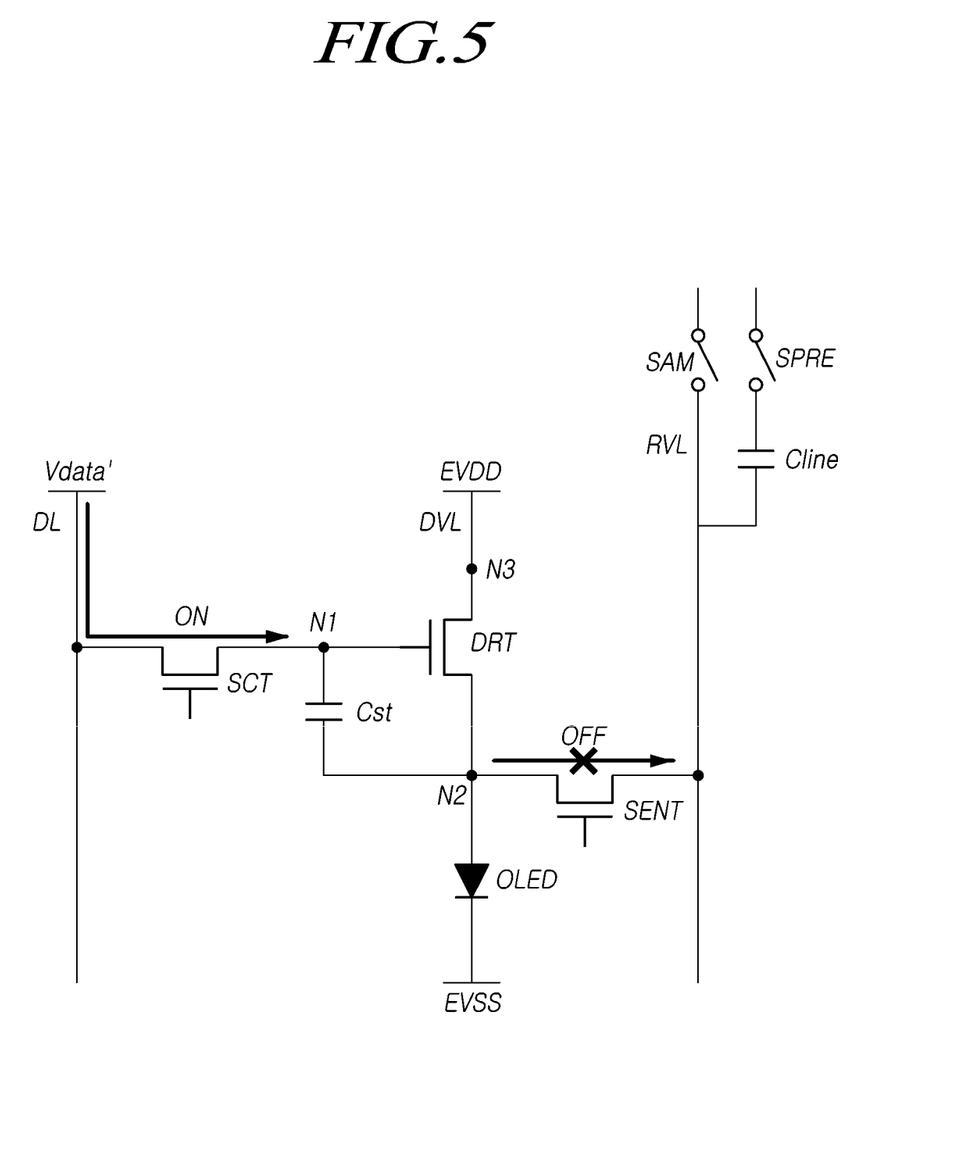
Figure 6:
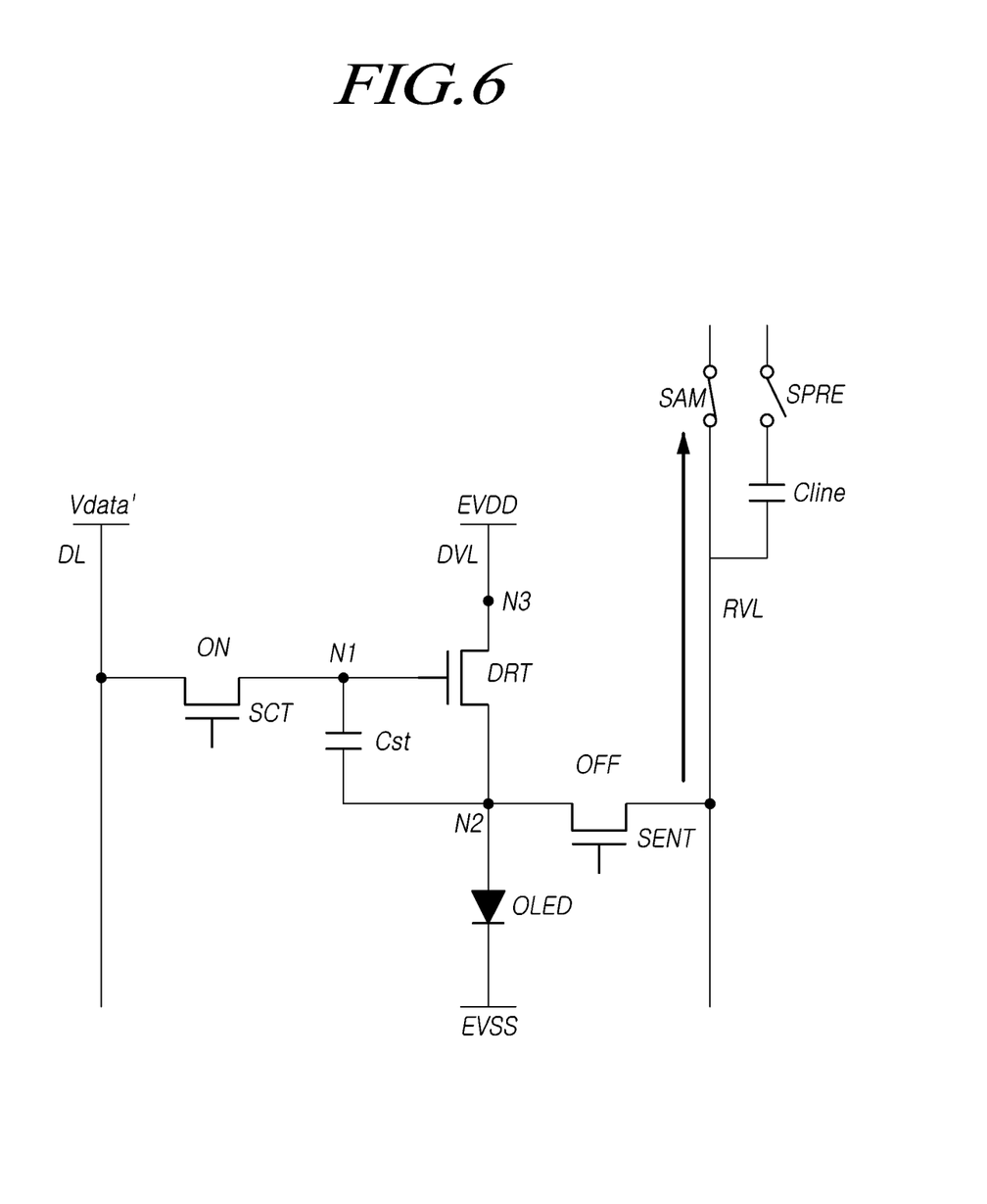

FIGS. 4 to 6 specifically illustrate a process of detecting a defect of a sensing transistor SENT in the organic light emitting display device 100 according to the present example embodiments.

FIG. 4 illustrates a process before performing a logic for detecting a defect of the sensing transistor SENT.

Referring to FIG. 4, before performing a logic for detecting a defect of the sensing transistor SENT, the reference voltage control switch SPRE connected to the reference voltage line RVL is turned on.

The reference voltage control switch SPRE connected to the reference voltage line RVL is turned on to initialize the reference voltage line RVL.

The reference voltage line RVL is initialized so that a voltage change of the reference voltage line RVL is sensed to detect whether the sensing transistor SENT is defective.

When initialization of the reference voltage line RVL is completed, the reference voltage control switch SPRE is turned off so that a capacitor Cline connected to the reference voltage line RVL may be charged according to the voltage of the reference voltage line RVL.

FIG. 5 illustrates a process of controlling a voltage and a signal which are applied to the sub pixel to detect the defect of the sensing transistor SENT.

Referring to FIG. 5, the voltage and the signal which are applied to each sub pixel after completing the initialization of the reference voltage line RVL are controlled to detect whether the sensing transistor SENT is defective.

The driving voltage EVDD is applied to the driving voltage line DVL and the base voltage EVSS is applied to the second electrode of the organic light emitting diode OLED.

For example, a driving voltage EVDD of 26 V is applied to the driving voltage line DVL and the base voltage EVSS of 6.5 V is applied to the second electrode of the organic light emitting diode OLED.

Further, the defect detecting data voltage Vdata' is applied to the data line DL. For example, a defect detecting data voltage Vdata' of 10 V may be applied.

A high level signal is applied to a gate node of the scan transistor SCT so that the scan transistor SCT is on and a low level signal is applied to a gate node of the sensing transistor SENT so that the sensing transistor SENT is off. As described herein, the scan transistor SCT may be turned on after the sensing transistor SENT is turned off.

Since the scan transistor SCT is on, the defect detecting data voltage Vdata' which is applied through the data line DL is applied to the gate node of the driving transistor DRT.

As the defect detecting data voltage Vdata' which is applied through the data line DL is applied to the gate node of the driving transistor DRT, the driving voltage EVDD is applied to the second node N2.

When the voltage is applied to the second node N2, the sensing transistor SENT is off, so that the voltage of the second node N2 is not applied to the reference voltage line RVL.

However, when the sensing transistor SENT is defective due to the foreign substance, the voltage applied to the second node N2 is applied to the reference voltage line RVL through the sensing transistor SENT so that the capacitor Cline connected to the reference voltage line RVL is charged.

FIG. 6 illustrates a process of determining whether the sensing transistor SENT is defective after controlling the sub pixel to detect the defect of the sensing transistor SENT.

Referring to FIG. 6, when a predetermined time elapses after applying the defect detecting data voltage Vdata' to the data line DL in an on state of the scan transistor SCT and an off state of the sensing transistor SENT, the voltage of the reference voltage line RVL is sensed.

The sensing unit 310 turns on the sampling switch SAM connected to the reference voltage line RVL to sense the voltage of the reference voltage line RVL.

When the voltage is applied to the second node N2, the sensing transistor SENT is turned off. Therefore, when the sensing transistor SENT is normal, a voltage state of the reference voltage line RVL is an initialized voltage state.

When the sensing transistor SENT is defective, a higher voltage of the reference voltage line RVL, which is charged by the voltage applied to the second node N2, is sensed.

The sensing unit 310 transmits the sensed voltage value in the reference voltage line RVL to the defect detecting unit 320.

The defect detecting unit 320 compares a voltage sensed by the sensing unit 310 and a predetermined voltage and determines whether the sensing transistor SENT is defective.

When the sensed voltage is a voltage equal to an initialized voltage of the reference voltage line RVL or is lower than a predetermined voltage (i.e., a threshold voltage), the defect detecting unit 320 determines that the sensing transistor SENT is normal.

When the sensed voltage is higher than an initialized voltage (a specific example of the predetermined voltage) or higher than a predetermined voltage, the defect detecting unit 320 determines that the sensing transistor SENT is defective.

When it is determined that the sensing transistor SENT is defective, the defect detecting unit 320 stores a coordinate of a sub pixel in which the sensing transistor SENT determined to be defective is disposed, in the memory 330, configured to be retrieved as a coordinate of a sub pixel in which a defective sensing transistor SENT due to, e.g., a foreign substance generated after the shipment of the organic light emitting display device 100 is disposed.

Figure 7:
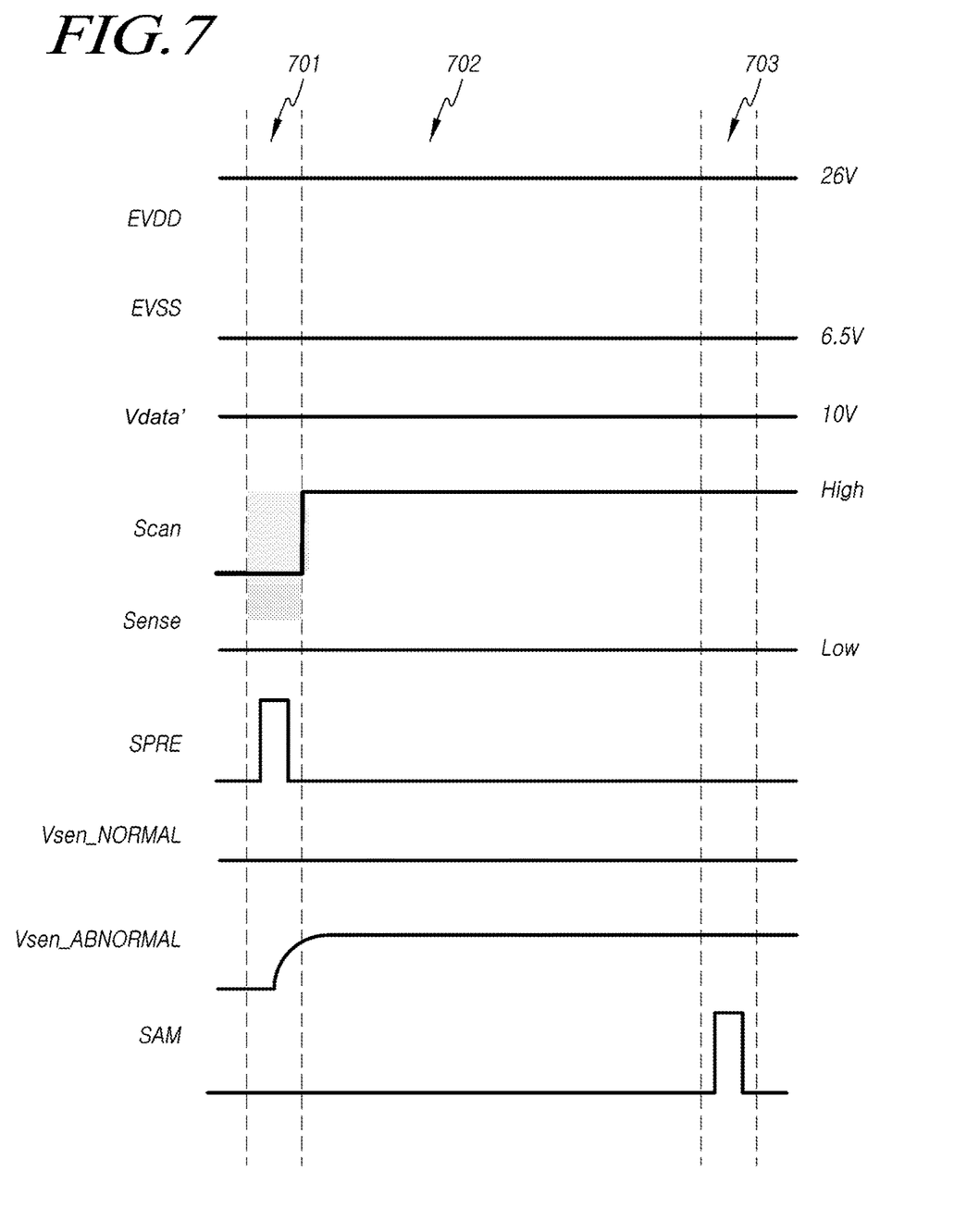
FIG. 7 is a view illustrating a timing of a voltage and a signal according to a logic for detecting a defect of a sensing transistor in an organic light emitting display device according to the present example embodiments.

FIG. 7 illustrates an example timing diagram of voltages and signals applied to a sub pixel during a process of detecting a defect of a sensing transistor SENT by the organic light emitting display device 100 according to the present example embodiments.

Referring to FIG. 7, the timing may be divided into an interval 710 in which the reference voltage line RVL is initialized to detect the defect of the sensing transistor SENT, an interval 702 in which a logic for detecting the defect of the sensing transistor SENT is performed, and an interval 703 in which it is determined whether the sensing transistor SENT is defective.

During the interval 701, the reference voltage line RVL is initialized. Also, the driving voltage EVDD of 26 V is applied to the driving voltage line DVL and the base voltage EVSS of 6.5 V is applied to the second electrode of the organic light emitting diode OLED. Further, the defect detecting data voltage Vdata' of 10 V is applied to the data line DL.

It should be appreciated that it is not necessary that the driving voltage EVDD, the base voltage EVSS and the defect detecting data voltage Vdata' be applied in interval 701. One or more of them may be applied in interval 702, which are all included in the disclosure.

A high level signal is applied to a gate node of the scan transistor SCT so that the scan transistor SCT is at an on state and a low level signal is applied to a gate node of the sensing transistor SENT so that the sensing transistor SENT is at an off state. As described herein the turning on of the scan transistor SCT and the turning off of the sensing transistor SENT may occur concurrently or may occur with different timing. Namely, the turning on of the scan transistor SCT may occur later than the turning off of the sensing transistor.

In an example, the turning off of the sensing transistor SENT occurs before or concurrently with the turning on of the reference voltage control switch SPRE.

In an example, the reference voltage control switch SPRE connected to the reference voltage line RVL is turned on at a timing when the scan transistor SCT is at an on state to initialize the reference voltage line RVL.

In another example, the reference voltage control switch SPRE is turned on, before the scan transistor SCT is turned to an on state, to initialize the reference voltage line RVL.

Figure 8:
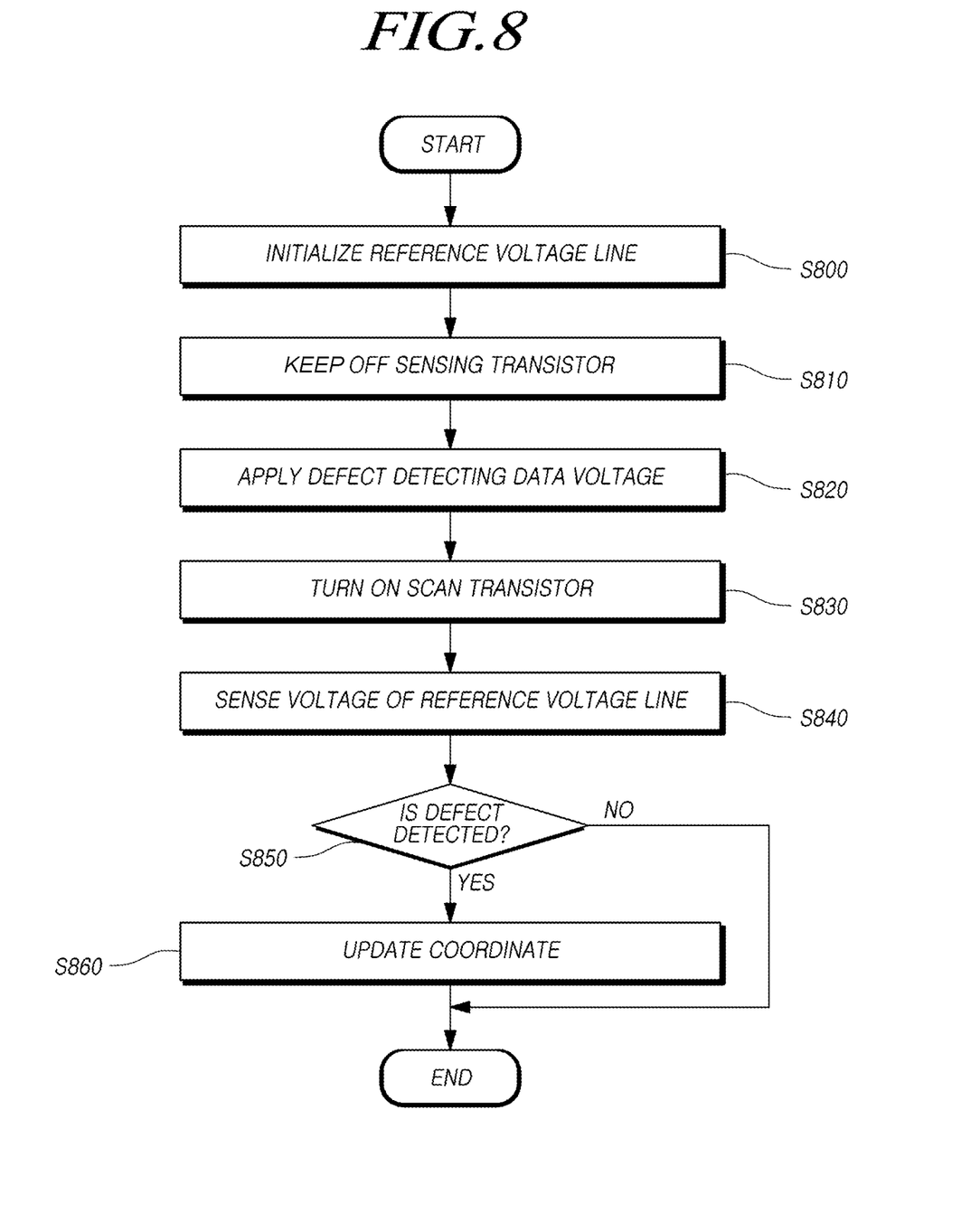
FIG. 8 is a flowchart illustrating a process of a driving method of an organic light emitting display device according to the present example embodiments.

During the interval 702 in which the logic of detecting the defect of the sensing transistor SENT is performed, a voltage is applied to the second node N2 connected to the sensing transistor SENT by the voltage applied to the sub pixel and the turned-on scan transistor SCT. Specifically, for example, a high level signal is applied to a gate node of the scan transistor SCT so that the scan transistor SCT is turned or kept at an on state, and a low level signal is applied to a gate node of the sensing transistor SENT so that the sensing transistor SENT is kept at an off state. FIG. 8 shows, as an illustrative example, that the high level signal is applied to the scan transistor SCT at the stating of the second interval 701, which does not limit the scope of the disclosure. As discussed herein, the high level signal may be applied to the scan transistor SCT before the starting of the second interval 702 or may be before the starting of the first interval 701.

It should be appreciated that the turning on of the scan transistor SCT and the driving transistor DRT all may involve some delay and to simplify the disclosure, such delays are not reflected in the timing diagram of FIG. 7. For example, the scan signal may be switched to high a little bit before the starting point of the second interval 702 to accommodate for the delays.

Further, the voltage of the reference voltage line RVL connected to the sensing transistor SENT is changed depending on whether the sensing transistor SENT is normal.

For example, when the sensing transistor SENT is normal, the voltage of the reference voltage line RVL is maintained to be an initialized voltage state (Vsen_normal).

When the sensing transistor SENT is defective, the voltage of the reference voltage line RVL rises by the voltage applied to the second node N2 (Vsen_abnormal).

The sampling switch SAM connected to the reference voltage line RVL is turned on to sense the voltage of the reference voltage line RVL during the interval 703 in which it is determined whether the sensing transistor SENT is defective.

When the sensing transistor SENT is normal, an initialized voltage of the reference voltage line RVL is sensed. In contrast, when the sensing transistor SENT is defective, a voltage which rises by the voltage of the second node N2 is sensed.

Therefore, it is possible to determine whether the sensing transistor SENT is defective by sensing the voltage of the reference voltage line RVL and a defect detecting logic of the sensing transistor SENT is performed by the voltage and the signal which are applied to each sub pixel so that it is possible to precisely extract a coordinate of the sub pixel in which the defective sensing transistor SENT is disposed.

Further, the coordinate of the sub pixel disposed in which the sensing transistor SENT which is determined to be defective is compared with the coordinate stored in the memory 330 and the coordinate stored in the memory 330 is updated, so that it is possible to detect the defect of the sensing transistor SENT which is progressively generated.

Further, the extracted coordinate may be used to repair the sub pixel in which the sensing transistor SENT is defective.

FIG. 8 illustrates a process of detecting a defect of a sensing transistor SENT in the organic light emitting display device 100 according to the present example embodiments.

Referring to FIG. 8, the reference voltage line RVL is initialized (S800) and the sensing transistor SENT is kept off so that the sensing transistor SENT is at an off state (S810). It should be appreciated that the sensing transistor SENT may be turned off and kept at the off state before the initializing the reference voltage line RVL.

The defect detecting data voltage Vdata' is applied to the data line DL (S820) and the scan transistor SCT is turned on so that the scan transistor SCT is at on state (S830).

When the scan transistor SCT is at on state and the sensing transistor is at an off state and after a predetermined time elapses, the voltage of the reference voltage line RVL is sensed (S840).

The sensed voltage of the reference voltage line RVL is compared with the initialized voltage of the reference voltage line RVL or a predetermined voltage (threshold voltage) and whether the sensing transistor SENT is defective is determined according to the comparison result.

When it is determined that the sensing transistor SENT is defective (S850), a coordinate of the sub pixel in which the defective sensing transistor SENT is disposed is updated (S860). Namely, the coordinate of the sub pixel in which the defective sensing transistor SENT is disposed is stored in the memory 330.

By doing this, the defective sensing transistor SENT, e.g., being defective due to a foreign substance or any other reasons for defect, is detected and the coordinate of the sub pixel in which the sensing transistor SENT is disposed is extracted.

Accordingly, the defect of the sensing transistor SENT which is generated after shipment of the organic light emitting display device 100 is detected and the coordinate of the sub pixel in which the defective sensing transistor SENT is disposed is updated so that it is possible to easily repair the sub pixel.

It will be appreciated that various example embodiments of the present disclosure have been described herein for purposes of illustration, and that various modifications, changes, and substitutions may be made by those skilled in the art without departing from the scope and spirit of the present disclosure. Further, the example embodiments disclosed herein are intended to not limit but describe the technical spirit of the present disclosure and the scope of the technical spirit of the present disclosure is not restricted by the example embodiments. The protection scope of the present disclosure should be interpreted based on the following appended claims and it should be appreciated that all technical spirits included within a range equivalent thereto are included in the protection scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting display device, comprising:
an organic light emitting diode;
a driving transistor that is electrically connected between the organic light emitting diode and a driving voltage line;
a scan transistor that is electrically connected between a first node of the driving transistor to which a data voltage is applied and a data line;
a sensing transistor that is electrically connected between a second node at which the driving transistor and the organic light emitting diode are connected and a reference voltage line;
a sensing unit that is selectably electrically connectable to the reference voltage line, the sensing unit sensing a voltage of the reference voltage line during an interval in which a defect detecting data voltage is applied to the data line, the scan transistor is at an on state, and the sensing transistor is at an off state; and
a defect detecting unit that compares the voltage of the reference voltage line sensed by the sensing unit with a threshold voltage and determines that the sensing transistor is defective if the voltage of the reference voltage line is higher than the threshold voltage.

2. The organic light emitting display device according to claim 1, further comprising:
a memory that stores a coordinate of a pixel having a defective sensing transistor.

3. The organic light emitting display device according to claim 2, wherein when it is determined that the sensing transistor is defective, the defect detecting unit compares a coordinate of a pixel in which a sensing transistor determined to be defective is disposed and a coordinate stored in the memory and updates the coordinate stored in the memory.

4. The organic light emitting display device according to claim 1, further comprising:
a reference voltage control switch that is connected to the reference voltage line,
wherein the reference voltage control switch is turned on to initialize the reference voltage line before the sensing unit senses the voltage of the reference voltage line.

5. The organic light emitting display device according to claim 4, wherein the reference voltage control switch is turned on at a timing when the sensing transistor is at the off state.

6. The organic light emitting display device according to claim 1, further comprising:
a sampling switch that is connected to the reference voltage line, wherein when a predetermined time elapses after the defect detecting data voltage is applied to the data line and the scan transistor is at the on state, the sensing unit turns on the sampling switch to sense the voltage of the reference voltage line.

7. A device; comprising:
a sensing unit configured to sense a voltage of a reference voltage line associated to a pixel during an interval when a defect detecting data voltage is applied to a data line of the pixel, a scan transistor connected between a first node of a driving transistor of the pixel and the data line is at an on state and a sensing transistor connected between a second node of the driving transistor and the reference voltage line is at an off state;
a defect detecting unit configured to compare the voltage sensed by the sensing unit with a threshold voltage and to determine whether the sensing transistor is defective based on a result of the comparing; and
a memory configured to store a coordinate of a pixel in which a sensing transistor determined to be defective by the defect detecting unit is disposed.

8. The device according to claim 7, further comprising:
a reference voltage control switch that is connected to the reference voltage line, the reference voltage control switch being configured to be turned on to initialize the reference voltage line before the sensing unit senses the voltage of the reference voltage line.

9. The device according to claim 7, further comprising:
a sampling switch that is connected to the reference voltage line, the sampling switch being configured to be turned on to sense the voltage of the reference voltage line after a predetermined time elapses after the sensing transistor is at the off state and the scan transistor is at the on state.

10. The device according to claim 7, wherein the defect detecting unit is configured to compare a coordinate of a pixel in which the sensing transistor detected to be defective is disposed with a coordinate stored in the memory and to update the coordinate stored in the memory.

11. A method, comprising:
turning on a reference voltage control switch connected to a reference voltage line to initialize the reference voltage line;
turning off a sensing transistor connected to the reference voltage line;
applying a defect detecting data voltage to a data line;

turning on a scan transistor;

sensing a voltage of the reference voltage line; and determining that the sensing transistor is defective when the sensed voltage higher than a threshold voltage.

12. The method according to claim 11, wherein the sensing the voltage of the reference voltage line includes:

sensing the voltage of the reference voltage line when the scan transistor is kept on and after a predetermined time elapses.

13. The method according to claim 11, further comprising:

storing in a memory a coordinate of a pixel in which the sensing transistor is disposed, when it is determined that the sensing transistor is defective.

14. The method of claim 11, wherein the turning off the sensing transistor occurs before the turning on a reference voltage control switch.

15. The method of claim 11, wherein the turning on the scan transistor occurs after the turning off the sensing transistor.

16. The method of claim 11, wherein the initializing the reference voltage line includes charging a capacitor connected to the reference voltage line.

17. The method of claim 13, wherein the storing in the memory the coordinate of the pixel in which the sensing transistor is disposed includes:

comparing the coordinate of the pixel with a stored coordinate stored in the memory; and storing the coordinate of the pixel in the memory in a case that the coordinate of the pixel is different than the stored coordinate.

18. The method of claim 11, wherein the reference voltage line, the data line, the sensing transistor, and the scan transistor are all associated to a same subpixel of an organic light emitting display device.

* * * * *